United States Patent [19]
Morgan

[11] Patent Number: 5,663,696
[45] Date of Patent: Sep. 2, 1997

[54] SAW FILTER WITH WAVE REFLECTIONS AND PHASE DIFFERENCES

[75] Inventor: David P. Morgan, Northampton, England

[73] Assignee: Advanced Saw Products SA, Bevaix, Switzerland

[21] Appl. No.: 426,854

[22] Filed: Apr. 24, 1995

[30] Foreign Application Priority Data

Apr. 25, 1994 [GB] United Kingdom ............ 9408188

[51] Int. Cl.$^6$ ........................................... H03H 9/64
[52] U.S. Cl. .......................... 333/194; 333/196; 310/313 B
[58] Field of Search ...................... 333/193, 194, 333/195, 196; 310/313 R, 313 B, 313 C, 313 D

[56] References Cited

U.S. PATENT DOCUMENTS

| 4,028,649 | 6/1977 | Komatsu et al. .............. 333/194 |
| 4,736,172 | 4/1988 | Ebneter ......................... 333/193 |

FOREIGN PATENT DOCUMENTS

| 5110378 | 4/1993 | Japan ........................... 333/193 |
| 566308  | 8/1977 | U.S.S.R. ...................... 333/193 |
| WO 93/08641 | 4/1993 | WIPO . |
| WO 93/13595 | 7/1993 | WIPO . |

OTHER PUBLICATIONS

Claiborne et al., "Low Loss Saw Filters Using Unidirectional Transducer Technology," *Proceedings of 1979 ISCAS*, Jul. 1979, pp. 609–612.

*Primary Examiner*—Benny T. Lee
*Assistant Examiner*—Justin P. Bettendorf
*Attorney, Agent, or Firm*—Perman & Green, LLP

[57] ABSTRACT

A SAW filter comprising a group of N tracks, where N is an odd integer greater than 2, and including an input interdigitated transducer (IDT) spaced apart from an output IDT. The respective tracks are selectable to have different effective electro-acoustic lengths such that surface acoustic waves launched from respective input IDTs undergo at least one reflection at corresponding output IDTs and at least one reflection from the respective input IDTs prior to generating coherent signals from respective output IDTs. The different effective electro-acoustic lengths may be substantially provided by there being different physical separation between input and output IDTs of respective tracks, or by IDTs of respective tracks having different polarity connections of electrodes or different amounts of material deposited in respective tracks between the input and output IDTs.

14 Claims, 10 Drawing Sheets

PHASES OF WAVES, TRACK 2 RELATIVE TO TRACK 1

PHASES OF OUTPUT SIGNALS, TRACK 2 RELATIVE TO TRACK 1

SAW FILTER WITH WAVE REFLECTIONS AND PHASE DIFFERENCES

FIELD OF THE INVENTION

This invention relates to a Surface Acoustic Wave (SAW) filter. In particular, it relates to a SAW filter comprising a plurality of tracks.

BACKGROUND TO INVENTION

SAW technology has found a number of applications in the electronics and RF art. Due to the fact that SAW wavelengths are typically $10^5$ times shorter than that of electromagnetic waves having a corresponding frequency, SAW technology has found particular applications where miniaturisation is important or desirable. One such application is the use of SAW filters in radio telephones where the typically small size and weight of SAW filters is highly advantageous over conventional technologies, such as ceramic filters, dielectric filters, and filters using magnetostatic principles. Generally, it is a requirement of such filters that they have low-loss, typically insertion losses of 1~3 dB for RF use, although for IF filters an insertion loss of 5~13 dB is acceptable.

A typical example of a conventional SAW filter is a SAW filter in which SAW energy is transferred between two spaced apart interdigital transducers (IDTs). The IDTs comprise two sets of equally spaced metal strips (electrode fingers), which are formed on the surface of a piezoelectric substrate. The electrode fingers in each set are typically electrically coupled together by bus-bars and are interleaved (interdigitated) with the electrode fingers of the other set. This arrangement can generate SAWs in both directions transverse to each electrode finger when an electrical voltage is applied between the sets of electrode fingers, and it can also generate an electrical voltage when SAWs are incident on the electrode fingers. These processes are most efficient when the frequency of the SAWs is such that the periodicity of the electrode fingers in each set is close to or the same as the SAW wavelength, or some multiple of this frequency. In the simplest form of IDT, the spacing between adjacent electrode fingers of a set of electrode fingers is one SAW centre wavelength, i.e. one electrode finger per period. However, it is possible to have more than one finger per SAW wavelength (period).

A particular path for a surface acoustic wave comprising SAW elements such as IDTs and/or reflection gratings is known as a track.

For conventional filters, to a first order the lengths of the transducers substantially determine the bandwidth of the filter since BW $\alpha$ $1/_L$ where L is the length of the transducers. Thus, the more narrow the bandwidth requirement the longer the transducers need to be. Increasing the length of transducers to decrease the bandwidth of the filter mitigates against advantages of small size usually associated with SAW devices. In particular, there has recently been a requirement for narrow-band filters for portable apparatus, and it is desirable to be able to provide such narrow-band devices without any increase in the size of the components and preferably with a decrease in the size of the components relative to conventional components and known SAW devices.

BRIEF SUMMARY OF INVENTION

The present invention provides a SAW filter comprising a group of N tracks, where N is an odd integer greater than 2, including an input interdigitated transducer (IDT) spaced apart from an output IDT, wherein respective tracks are adapted to have different effective electro-acoustic lengths such that surface acoustic waves launched into respective tracks from the input IDT undergo at least one reflection at the corresponding output IDT and at least one reflection from said input IDT prior to forming a substantially coherent signal at the output IDT.

This has the advantage that the effective length of the tracks can be increased at least threefold. Thereby providing a decrease in length whilst maintaining filter performance or increasing filter performance whilst maintaining or possibly even decreasing the filter length. Such an increase in filter performance is, for example, improved sidelobe rejection which increases with the number of reflections. Additionally, filters in accordance with the present invention have low loss. This makes SAW filters in accordance with the invention highly attractive since they are cheaper to design and to manufacture since less substrate material and packaging material need to be used. If apodized or weighted transducers are used even lower sidelobe rejection is possible.

Furthermore, if only one input and output IDT are used the bus bars used to feed the IDTs can be easily routed so that they do not interfere with the acoustic channels. This reduces the complexity of the layout and obviates the need to consider the effect of bus bars on the acoustic propagation of the SAWs.

Alternatively, the output IDT comprises N respective output IDTs electrically coupled together and/or the input IDT comprises N respective input IDTs electrically coupled together, and corresponding to the respective tracks.

In a preferred embodiment the effective electro-acoustic lengths of respective tracks are selected such that signals from respective tracks undergoing less than a total of N−1 reflections are mutually cancelled. This has the advantage that SAWs having a frequency substantially equal to the centre frequency of the filter undergo an optimum number of reflections for a given number N of tracks, before giving a coherent output.

Suitably, the effective electro-acoustic lengths of respective tracks have phase differences relative to a reference track corresponding to $2\pi mr/N$ where r corresponds to a sequential integer number of each track relative to the reference track and where m is the number of transits of the device made by a signal.

The phase difference between respective tracks can be achieved in a number or combination of the following ways. For example, the electrode connections of at least one of the respective input or respective output IDTs may be reversed with respect to the polarity of the electrode connections of the IDTs of other tracks;

the different effective electro-acoustic lengths may be substantially provided by respective tracks having different physical separation between the input and output IDT;

different effective electro-acoustic lengths may be substantially provided by different amounts of material disposed in respective tracks between the input and output IDT; or the different effective electro-acoustic lengths may be substantially provided by electrical phase shifting networks such as inductors and/or capacitors.

Optionally, the IDTs may comprise single electrode IDTs or directional IDTs such as SPUDTs. These are well known devices in the art and thus would be relatively straightforward to implement in the present invention. Additionally, devices using SPUDTs exhibit a lower level of ripple in their passband characteristics, thereby improving the overall performance of such devices compared with devices using single-electrode IDTs. A particular advantage of single electrode IDTs is that their electrodes can be made comparatively wider than the electrodes of multi-electrode IDTs. Thus, they are easier to fabricate for high frequencies and have higher manufacturing tolerances than multi-electrode IDTs.

In a particular embodiment the respective input and respective output IDTs may be electrically coupled in series. This has an advantage in that it increases the input and output impedance which may be desirable for some practical uses of the invention.

Suitably, if the IDTs are coupled in series, multi-electrode IDTs can be utilised, i.e. IDTs wherein the respective input and respective output IDTs each have more than one electrode per period.

If different electro-acoustic lengths are substantially provided by electrodes in corresponding periods of IDTs in respective tracks having different polarity connections, then phase differences between tracks can be achieved without having to adjust the physical separation of the respective input and respective output IDTs. This has the advantage that the relative phase differences are substantially the same for a relatively wide band of frequencies about the centre frequency of operation of the device. Additionally, the physical displacement of IDTs is minimised or eliminated. This results in fewer phase mismatches, and hence lower side lobes, due to changes in frequency.

A particular advantage of embodiments in accordance with the invention is that the overall length of the tracks and hence of the device can be minimised since the reflecting mechanisms are incorporated into the IDTs, or arise by virtue of the forms of electrical coupling between the IDTs.

DETAILED DESCRIPTION OF EMBODIMENTS OF THE INVENTION

Specific embodiments of the invention will now be described, by way of example only, and with reference to the accompanying drawings.

Figure 1:
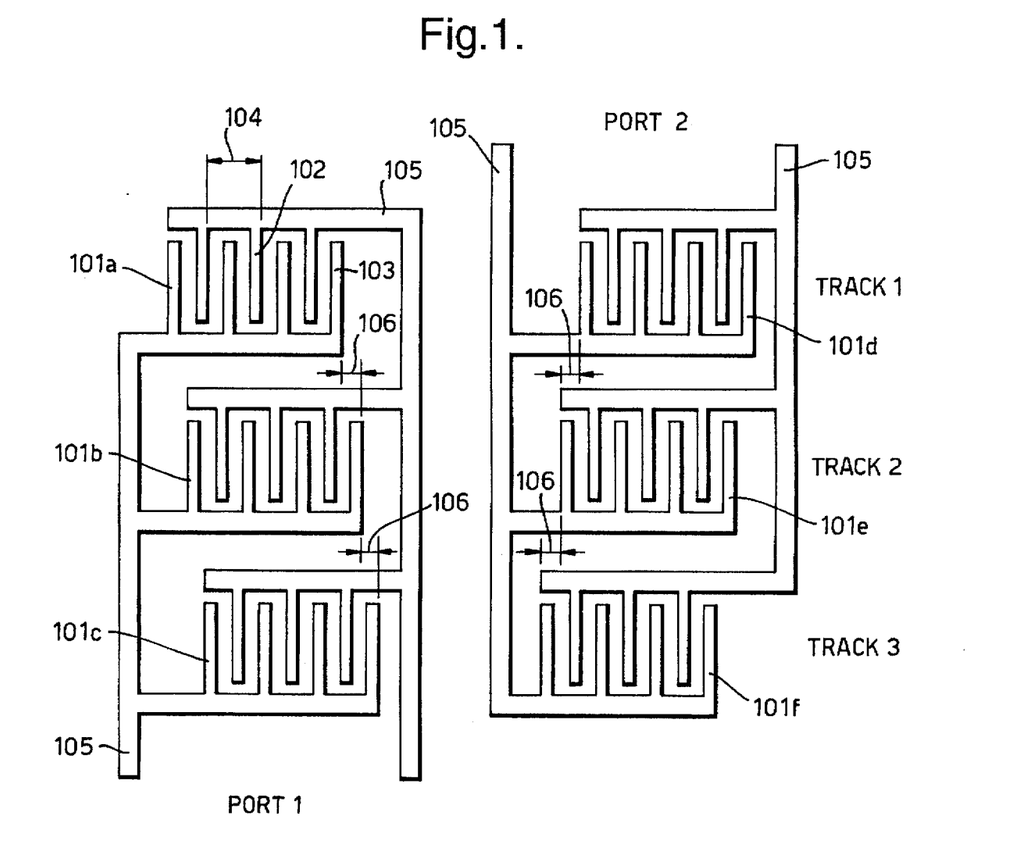
FIG. 1 is a schematic diagram of a 3 track device the relative dispositions of input and output IDTs.

FIG. 1 shows a three track device in accordance with the invention, having six substantially identical transducers (IDTs) 101. The device comprises single-electrode IDTs only, i.e. transducers having only one electrode 102, 103 connected to respective polarities per IDT period 104. The three left-hand IDTs are connected in parallel to form an input (Port 1) and the three right-hand transducers are connected in parallel to form an output (Port 2), for the device. Electrodes having the same polarity are connected together by bus-bars 105, which are also used to connect IDTs together. For such a device the IDTs are designed to have quite high reflection coefficients when shorted, e.g. −2 dB.

Each IDT 101 of each track is disposed by a distance 106 of a sixth of an acoustic wavelength ($\lambda a/6$) relative to a corresponding IDT located in an adjacent track. Thus, IDT 101a is disposed a distance 106 of $\lambda a/6$ further to the left than IDT 101b, and IDT 101b is disposed a distance 106 of $\lambda a/6$ further left than IDT 101c. Correspondingly, IDT 101d is disposed $\lambda a/6$ further right than 101e, and IDT 101e is disposed $\lambda a/6$ further right than IDT 101f. Therefore, the spacing between input and output IDTs 101 of tracks 1 to 3 sequentially decrease by $\lambda a/3$, such that the separation of input and output port IDTs 101 of track 2 is $\lambda a/3$ less relative to track 1 and the separation of input and output IDTs 101 of track 3 is $2\lambda a/3$ less relative to track 1.

Figure 2A:
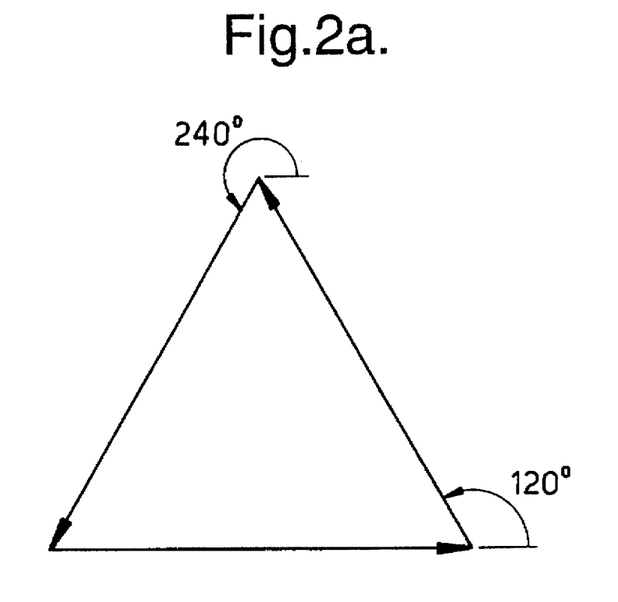
FIG. 2 shows vector representations of the relative phases of signals from individual output IDTs for the device shown in FIG. 1.

A signal input at port 1 is split into 3 substantially identical voltage portions, each portion applied across respective input IDTs 101a, 101b, 101c. Each input IDT 101a, 101b, 101c launches SAWs which are respectively incident on each corresponding output IDT 101d, 101e, 101f. SAWs incident on IDT 101e are −120° out of phase with SAWs incident on IDT 101d, and SAWs incident on IDT 101f are −240° out of phase with SAWs incident on IDT 101d. The vector sum of the transduction voltages produced across each output IDT 101d, 101e and 101f by respectively incident SAWs is zero, as schematically shown in FIG. 2a. Note, it is a characteristic of single-electrode IDTs that they give substantial reflections (at the nominal centre frequency of the IDT) when they are shorted, i.e. have no voltage applied across them. Thus, the SAWs incident on output IDTs 101d, 101e and 101f are reflected from respective output IDTs since by virtue of the vector sum of the voltages zero, and the output IDTs being connected in parallel, no voltage is applied across each IDT 101d, 101e and 101f. Since a signal applied at an input IDT and received at an output IDT undergoes both acoustic and electrical effects, a track comprising input and output IDTs shall be described as having an equivalent electro-acoustic length. This terminology refers to the fact that the effective separation of IDTs in terms of phase (which corresponds to length) is dependent upon both electrical and acoustic effects.

Figure 2B:
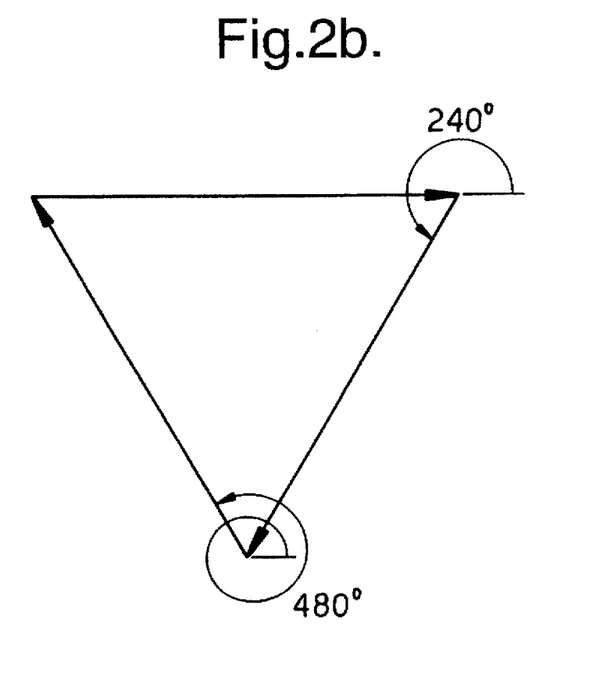

The SAWs reflected from respective output IDTs 101d, 101e and 101f are next incident on corresponding input IDTs 101a, 101b and 101c. The respective phase differences of incident SAWs in tracks 2 and 3 relative to track 1 is now −240° and −480°. Again, as shown in FIG. 2b, the vector sum of the transduction voltages is zero. Thus there is no net voltage from the IDTs, and the SAWs are reflected towards the output IDTs.

The sign convention adopted is that a positive phase change corresponds to an increase in delay.

The SAWs reflected from respective input IDTs 101a, 101b and 101c are next incident on corresponding output IDTs 101d, 101e and 101f, having phase differences of −360° and −720° relative to track 1 in tracks 2 and 3 respectively. Thus, the SAWs are coherently incident on the output IDTs and an output voltage is produced at the combined output of the output IDTs.

The effect of multiple reflections on the bandwidth of the filter is complex. The transduction processes at the input and output IDTs each act to form a frequency response of the form snx/x having a 4 dB bandwidth at approximately $1/_T$ and first order nulls at $2/_T$ where T is the length of the impulse response of respective IDTs (e.g. identical IDTs). The combined frequency response of a signal undergoing transduction at the input and output IDTs is the product of the individual frequency responses. Thus, the combined frequency response corresponding to the input and output IDTs has an 8 dB bandwidth at $1/_T$ indicating a reduction in bandwidth. However, the nulls are still at the same frequencies as before relative to that of a single IDT.

A corresponding argument applies to the effect of reflections, except that now the length of the impulse response is 2T since a SAW travels the length of an IDT and back again during reflection. The effect of multiple reflections on bandwidth can be derived by multiplying the effect of each single reflection together. A single reflection yields a 4 dB bandwidth at $1/_{2T}$ which is narrower than a single IDT on transduction, and 1st order nulls at $1/_T$. According to the foregoing arguments, M reflections will yield a 4M-dB bandwidth at $1/_{2T}$, but the 1st order nulls will still be at $1/_T$. Additionally, the rejection at the sidelobes will also be multiplied by M. As can be seen from the foregoing the effect of multiple reflections will dominate over the edominate over the effect of the input and output transductions. This clearly shows that narrower bandwidths are obtainable from a device which utilises multiple reflections than are obtainable from a device in which the signal undergoes two transductions, both devices having IDTs of the same length.

In the above example, a later transit (the 9th) will produce a second occurrence of coherence at the output IDTs which will add to the first occurrence of coherence. Thus, ripples will be introduced into the passband of the filter due to the signals undergoing only 3 transits. These ripples will be of little effect since the magnitude of a signal after 9 transits (8 reflections) will be greatly reduced.

It would of course be possible to have input and output IDTs of different length, but the longest IDT will dominate the response of the filter.

Figure 3A:
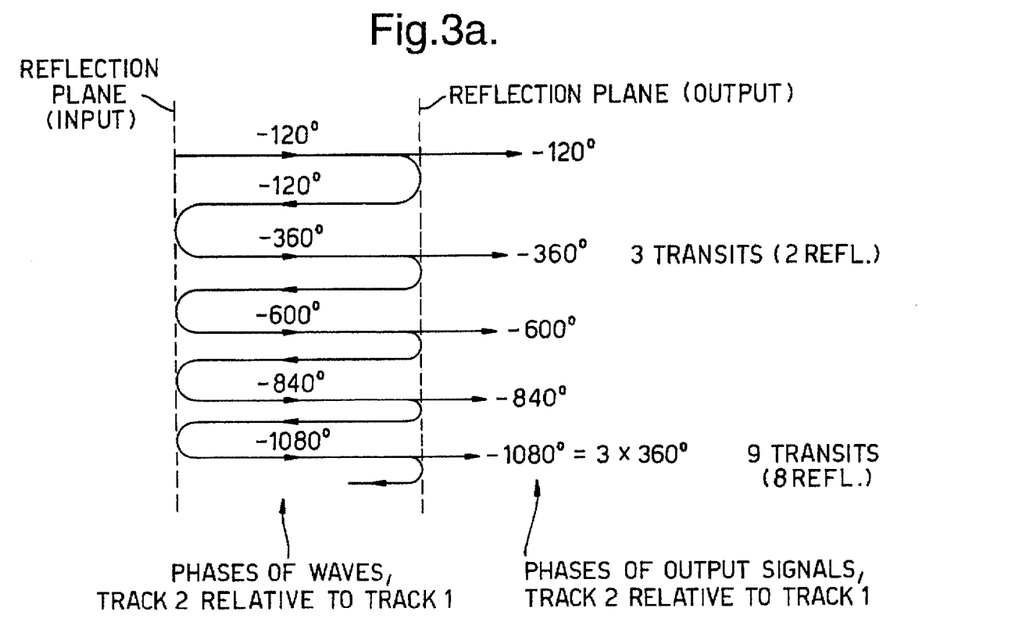
FIG. 3a is a diagrammatic representation of the relative phase of surface acoustic waves propagating in adjacent tracks.

A simple explanation of the increase in relative phase difference at each reflection is shown in FIG. 3a, for track 2. Clearly, to obtain the relative phase differences for track 3 the values shown in FIG. 3a need only be multiplied by two. This figure refers to a slightly modified configuration, in which the input transducers are displaced λa/3 from track to track and the output transducers are not displaced.

Although the device shown in FIG. 1 has respective input and output IDTs symmetrically disposed about a centre line of the device, each track could be moved an arbitrary distance left or right without changing the operation of the device providing that the relative effective electro-acoustic lengths are unchanged. Thus, the left or right IDTs could be in line with each other and the right or left IDTs of tracks 2 and 3 disposed by λa/3 or 2λa/3 (or integer multiples thereof) relative to the corresponding IDTs of track 1.

Figure 3B:
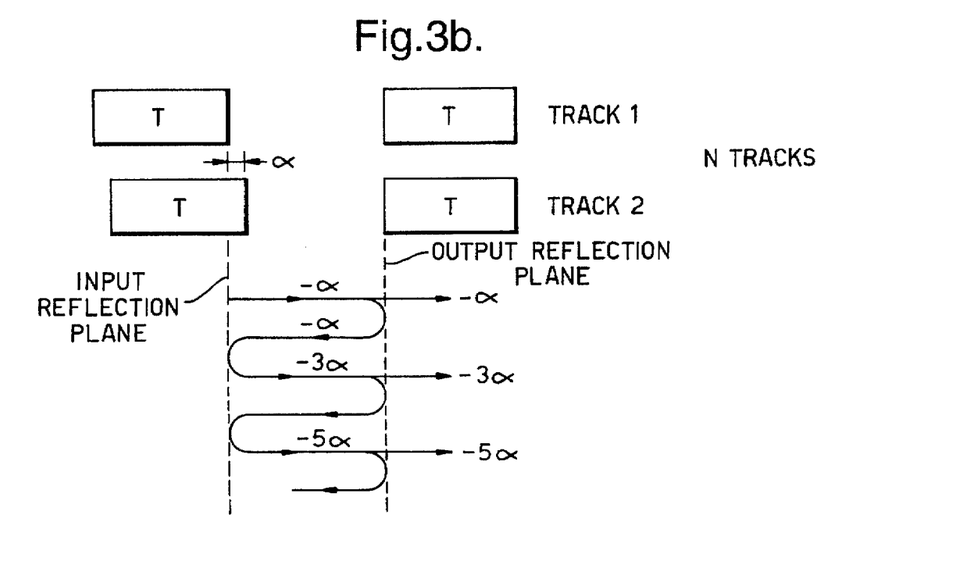
FIG. 3b is a diagrammatic representation of the general form of the relative phase of surface acoustic waves propagating in adjacent tracks.

A more general scheme would have N tracks, with transducer displacements of αλa/2π. This is illustrated in FIG. 3b, where only the first two tracks are shown. Additionally, the device shown in FIG. 3b is a non-symmetric device with the right hand IDTs (T) being in line with each other, and the left hand IDTs (T) being disposed by a distance αλa/2π relative to each other. The output signals have phases (track 2 relative to track 1) of α, 3α, 5α, etc. Here α is in radians.

In order to obtain the greatest benefit from a multi-reflection device it is necessary to maximise the number of transits before a coherent signal is produced at the output (right hand) IDTs(T). To do this the phase difference between respective adjacent tracks α is set in accordance with $$\alpha = \frac{2\pi r}{N}, \qquad (1)$$

where N is the total number of tracks and r is any integer corresponding to the arbitrary transducer displacement discussed here above. Clearly r cannot be equal to zero or a multiple of N, else the phase difference between tracks would be zero or an integer multiple of $2\pi$ which would be equivalent to a phase difference of zero. Based on the foregoing, the transducer open-circuit voltages have phase differences between adjacent tracks of $$\Delta\phi = \frac{-2\pi r \cdot m}{N} \qquad (2)$$

where m is the number of transits of the device made by a signal. Thus, $\Delta\phi$ is a multiple of $2\pi$ when m=N which gives the required coherent output.

It should be noted that if r and N have a common factor then it would be possible to have a coherent output for m<N. However, such a situation would be of dubious practical significance since the multi-reflection effect would not be maximised with respect to the number of tracks used.

The general equation governing the operation of multi-reflection devices is $$\sum_{n=0}^{N-1} \exp j\left[\frac{-2\pi nrm}{N}\right] \qquad (3)$$

which is equal to N if m is a multiple of N and equals zero for any other non-zero integer m, provided r and N have no common factors.

The first coherent output occurs when m=N, all other values of m preceding that result in a zero output in accordance with equation (3). This only works for N odd, since m must be odd. A second coherent output occurs when m=3N (m=2N being excluded since m must be odd).

When the output IDT open-circuit voltages are in phase, the N individual transducers combine to behave as if they were a single transducer having an aperture N times as great as the aperture of an individual transducer. In this situation, up to half of the acoustic power incident on the output transducers at coherence is transferred to the load. The exact fraction depending upon the load impedance.

The waves also induce voltages on the input transducers, at the left of FIG. 3(b). Although a voltage is applied to the input IDTs, the voltages and waves generated in response to incident waves are the same as if there were no applied voltage (this follows from the well-known superposition principle). The open-circuit voltages due to incident waves are again given by formula, $$\Delta\phi = \frac{-2\pi r \cdot m}{N} \qquad (2)$$

where m is now even. Since m is even and N is odd, these voltages are coherent only when m is an even multiple of N (assuming r and N have no common factors). For other m these voltages add to give zero and the transducers reflect as if they were shorted. The first transit giving coherent voltages is m=2N. For coherent voltages, some of the power of the incident waves is transferred to the source. By appropriately choosing the source impedance an acceptable reflection coefficient may be maintained. Thus, no adverse effect occurs to the overall filter characteristics due to coherence also occurring at the input transducers.

FIG. 4 shows the transfer characteristics of a 3 track device as before described and also the transfer characteristic of a 5 track device. The 3 track device is built on ST-quartz using parallel coupled single-electrode transducers having 80 periods. The reflection coefficient of individual electrodes is −0.007 and the width of the transducers is 1 mm (~22λ). The separation of the transducer centres in the first (reference) track is 88λ, and the input transducers of the other tracks are displaced by λ/3 and 2λ/3 respectively, relative to the reference track. At each end the device was series matched to the measuring apparatus by an inductor of 447.3 nH, and the impedance of the measuring apparatus was 35Ω. The 5 track device used similar transducers to those used in the 3 track device but having individual electrode reflection coefficients of −0.0085. Again the separation of the transducer centres is 88λ, but this time the displacement of adjacent transducers is λ/5. The measuring apparatus was series matched to the 5 track device by an inductor of 269.9 nH at each end, and the impedance of the measuring apparatus was 15Ω.

Figure 4A:
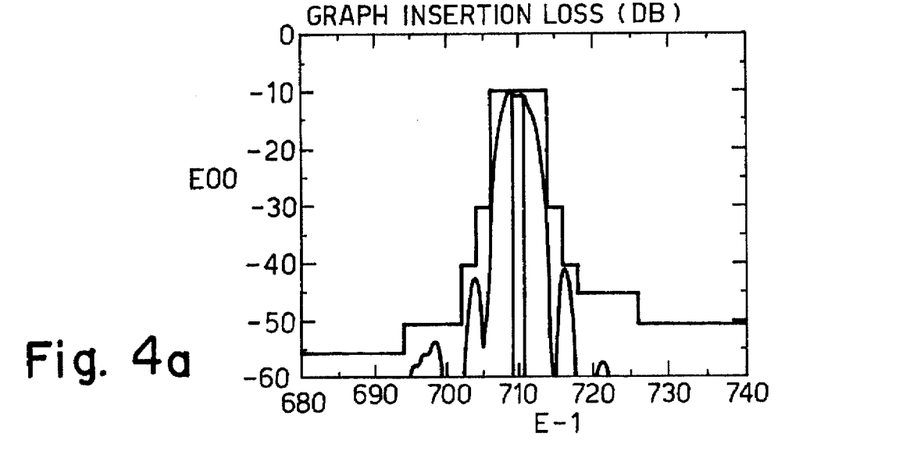
FIG. 4 shows results for 3 track and 5 track symmetric devices.
Figure 4B:
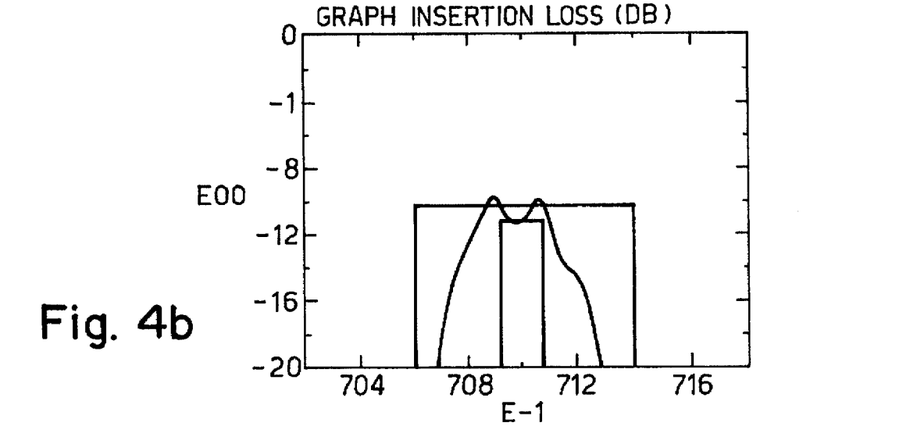
Figure 4C:
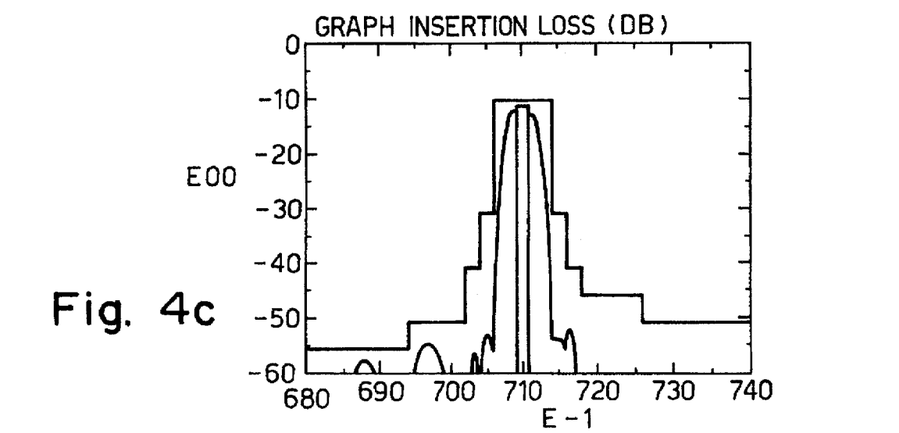

The transfer characteristic of the 3 track device is shown in FIG. 4a. A more detailed view of the transfer characteristic is shown in FIG. 4b. FIG. 4b shows that there is ~1.25 dB ripple superimposed on the transfer characteristic. Ripple can also be seen on the transfer characteristic of a five track device, as shown in FIG. 4c. The ripples are likely to have arisen from interference between the first and second output signals (i.e. the 3rd and 9th transits in the case of the 3-track device). However, these ripples can be controlled by varying the magnitude of the reflection coefficient. Because of the bi-directional nature of the transducers (they generate waves equally in both directions) there is an inherent minimum conversion loss during transduction of 6 dB, this figure referring approximately to the overall loss of the device when the ripple is averaged out.

Figure 5:
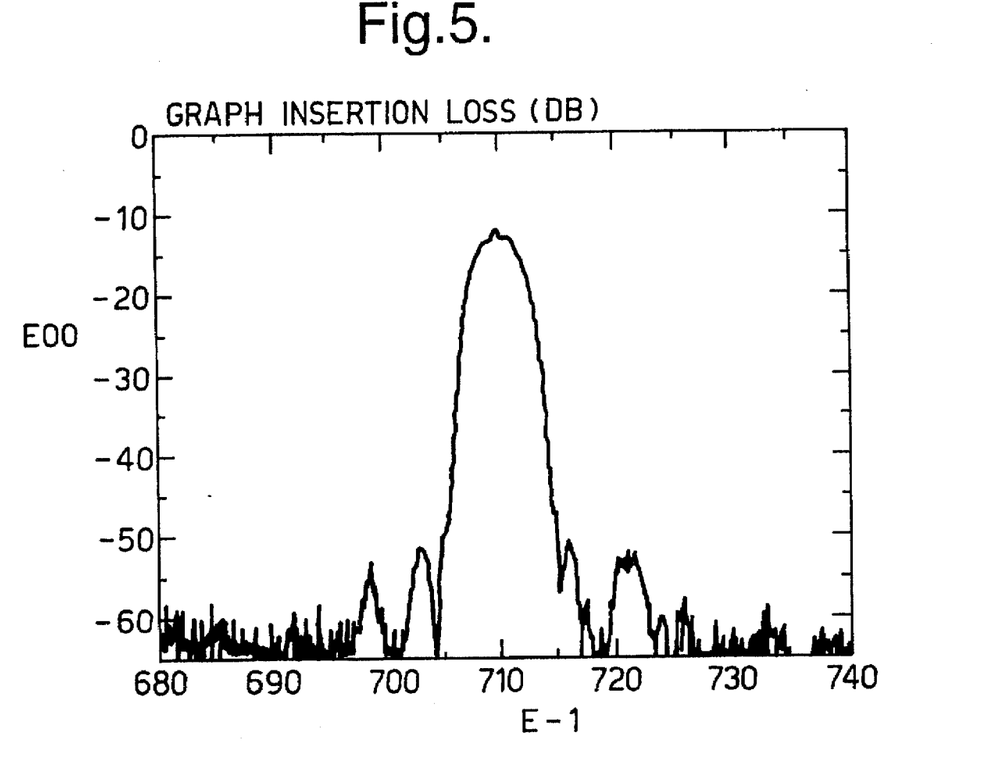
FIG. 5 shows experimental results for a 3 track device.

FIG. 5 shows experimental results for a non-symmetric 3 track device having six nominally identical transducers connected in parallel. The substrate material is ST-quartz having 37° orientation and propagation in the X direction. Each transducer is an unweighted SPUDT having 80 periods and an aperture of 20 wavelengths. The centre frequency of the SPUDTs is 71 MHz and the film thickness of the transducers is 7000 Å. The directivity of the device is 8.8 dB and it has a shorted reflection coefficient of −2.5 dB.

The first track has a transducer to transducer separation of 45 wavelengths. Subsequent tracks have the transducer at one end displaced inwards by λa/3 from track to track. As can be seen, the side lobes are below −50 dB. It is expected that these sidelobes can be reduced by placing absorber at the edges of the substrate, since it appears that the side-lobes are due to reflections from the edges of the substrate. Thus, side-lobes below −65 dB and even −60 dB may be attainable.

Figure 8A:
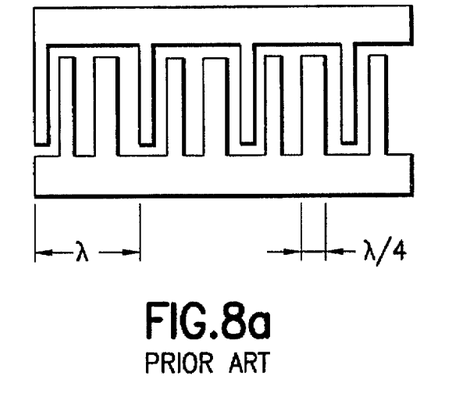
FIGS. 8a, 8b and 8c are schematic views of unidirectional transducers known in the prior art.
Figure 8B:
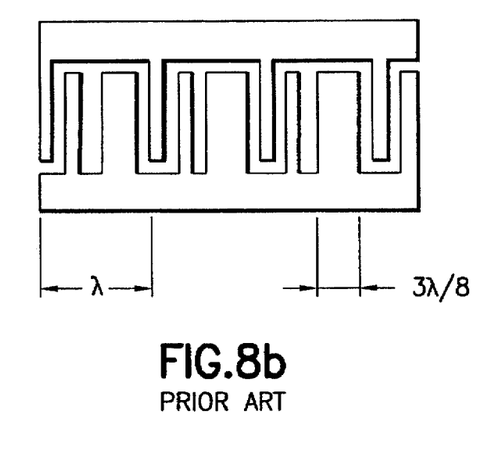
Figure 8C:
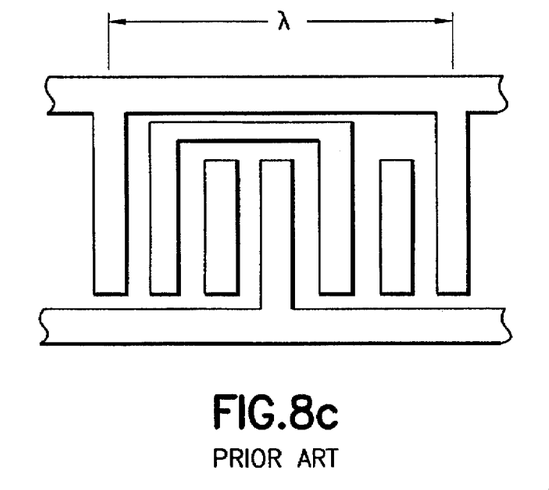

An alternative IDT suitable for a device as before described is a directional transducer an example of which is the so-called SPUDT transducer (Single-Phase Uni-Directional Transducer). FIGS. 8a, 8b and 8c show three types of Single-Phase Uni-Directional Transducers known in the prior art. The key feature of a SPUDT is that, for an applied voltage, surface waves are launched preferentially in one direction. This behaviour is obtained by distributing reflecting electrodes in the structure in such a way so as to reinforce waves generated in one direction.

The directivity of a SPUDT is high, and for a shorted SPUDT there is a substantial SAW reflection coefficient which is close to unity if the directivity is high. These features are obtained at and near the nominal centre frequency of the SPUDT. At other frequencies the SPUDT generally behaves in an approximately bidirectional manner.

In addition to giving a high reflection coefficient when shorted, a SPUDT has two additional features which are important:

a) When it is electrically matched, there is good conversion efficiency between the electrical port and the forward acoustic port (e.g. −1 dB). Thus there is efficient conversion of electrical signals to acoustic signals, and of acoustic signals to electrical signals.

b) The SPUDT can be electrically matched such that its acoustic reflection coefficient (at the forward port) is zero. The matching required is not quite the same as that for (a) above, but for high directivity (e.g. 10 dB or more) the two matching conditions are similar.

SPUDTs can be applied to the aforementioned devices, and oriented such that for an applied voltage they generate waves preferentially in the direction toward the centre of the device. Taking the 3-track device, shown in FIG. 1, replacing the single-electrode IDTs with SPUDTs and electrically matching the combination of 3 SPUDTs at each end a simple 3 track SPUDT device can be made. Waves are launched from the left with very little power loss as is characteristic of high directivity SPUDTs. After the first transit, they arrive at the output SPUDTs with 120° phase increments, and consequently there is no corresponding voltage developed as explained previously. Thus, the output SPUDTs behave as if they were shorted and hence the waves are reflected with very little loss again characteristic of high directivity SPUDTs. After the second transit the waves incident on the input SPUDTs again cause no voltage, and there is little loss on reflection. Thus, nearly all of the available electrical power arrives as waves at the output transducers after 3 transits. At this point the output voltages are in phase. Effectively the three output SPUDTs behave like one SPUDT with an aperture 3 times larger than a single SPUDT, and hence practically all of the power is transferred to the electrical load. In order to ensure good power transfer the SPUDTs are electrically matched to the load impedance so as to give zero reflection on transduction (the matching is as for one SPUDT with aperture N times larger than the actual SPUDTs). Such SPUDT devices give two advantages over a device using single-electrode devices:

a) Because the matching is close to that required for best conversion efficiency, the applied signal is converted efficiently into waves. Also, the coherent output is efficiently converted into an electrical output. Thus the insertion loss of the device is lower.

b) Unwanted signals are much reduced, since when the main output occurs (m=N) there is substantially no reflection of the waves, so there is no wave energy left to produce any subsequent signals. Even, if the conditions are not ideal and some small amount of energy is reflected unwanted signals are still much reduced. This is because there is also a suppression of reflections when m=2N, (i.e. when there is a coherent output at the input transducer), and thus there are two mechanisms suppressing the waves before the first unwanted signal (m=3N) can be produced. Consequently, amplitude and delay ripples in the device response are much reduced.

It should be noted that the loading does not have to be very close to the condition for zero reflection for such devices to work. Perfectly acceptable performances can be achieved for a wide range of loading.

The foregoing example was for SPUDTs having high directivity. However the advantages remain, to a lesser degree, if the directivity is modest. In this case the conversion of electrical to acoustic power is less efficient and the reflection coefficient of a shorted SPUDT is notably less than unity. Thus the device insertion loss will be larger, but it would be expected to be less than for single-electrode transducers. There are potential advantages in using modest directivities. Firstly, such devices can be made shorter than high-directivity ones. Secondly, for modest directivity the shorted reflection coefficient is lower, and this will help reduce the sidelobe levels in the reflection coefficient.

In the foregoing examples, the input and output IDTs are respectively coupled together in parallel. However, they could also be coupled together in series. There is no basic difference between the operation of devices having parallel or series coupling between IDTs. This can be explained by the following.

If the IDTs at respective ends of the device have a similar design, the IDT open-circuit voltages will have the same phase increment from track to track as the incident waves. If this phase increment is such that the sum of the open-circuit voltages is zero, and if the IDTs are connected in parallel, this will give zero voltage across the device terminals, and hence zero voltage across each IDT; thus each IDT reflects the waves as if it were shorted. If the IDTs are connected in series the total voltage across the device terminals must be zero, and this means that there is no current in the load. Since the IDTs are in series, this also implies that there is no current through each IDT, even though it has a voltage across its terminals (the voltage is the open-circuit voltage, since no current is being drawn). Thus each IDT will reflect SAW's as if it were open circuit, irrespective of the load impedance. The device operation is therefore almost the same as for the parallel case, except that (a) the open-circuit reflection coefficient will be quantitatively different to the short-circuit reflection coefficient, and (b) the device loading required will be substantially different.

An important difference between devices utilising series or parallel coupling is that different electrical matching is required. For example, the capacitance due to series coupled IDTs would be small compared to the capacitance of such IDTs coupled in parallel. Thus, a large inductor would be required to tune out the capacitance of the series coupled IDTs.

Series coupling of IDTs is of particular importance if multi-electrode IDTs are to be utilised. It is well known that the short-circuit reflection of multi-electrode IDTs is negligible and thus they would not be suitable for a multi-reflection device having IDTs coupled in parallel. However, when the phases of acoustic waves incident on the IDTs are out of phase series coupled multi-electrode IDTs would give appreciable open circuit reflections, and thus could be utilised in a multi-reflection device.

Figure 7:
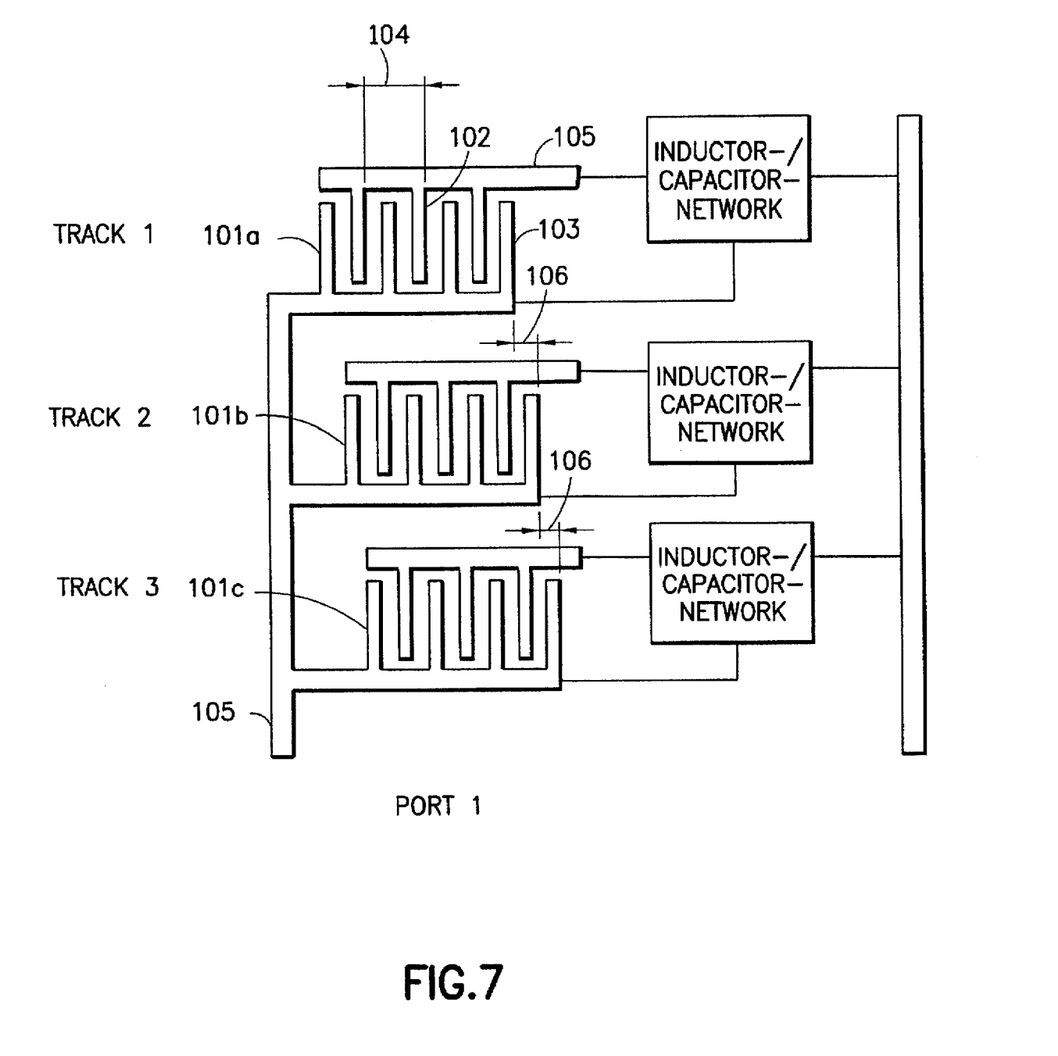
FIG. 7 is a schematic view of an electrical phase shifting network.

In the foregoing example the phase difference between tracks is obtained by appropriately displacing IDTs in one track relative to those in adjacent tracks. However, any method of providing a phase difference between tracks would be suitable for use in the present invention. For example, different length pads of materials such as conductors or thick regions of substrate material may be disposed between input and output IDTs of respective tracks. The effect of the pads would be to alter the velocity of a SAW as it propagated below the pad. Thus, different length pads would introduce phase differences between tracks. Also, respective input or output IDTs could be connected to each other via conventional electrical phase changing circuits comprising components such as inductors and capacitors. As seen in FIG. 7, different effective electro-acoustic lengths could be substantially provided by electrical phase shifting networks such as inductors and/or capacitors.

Figure 1A:
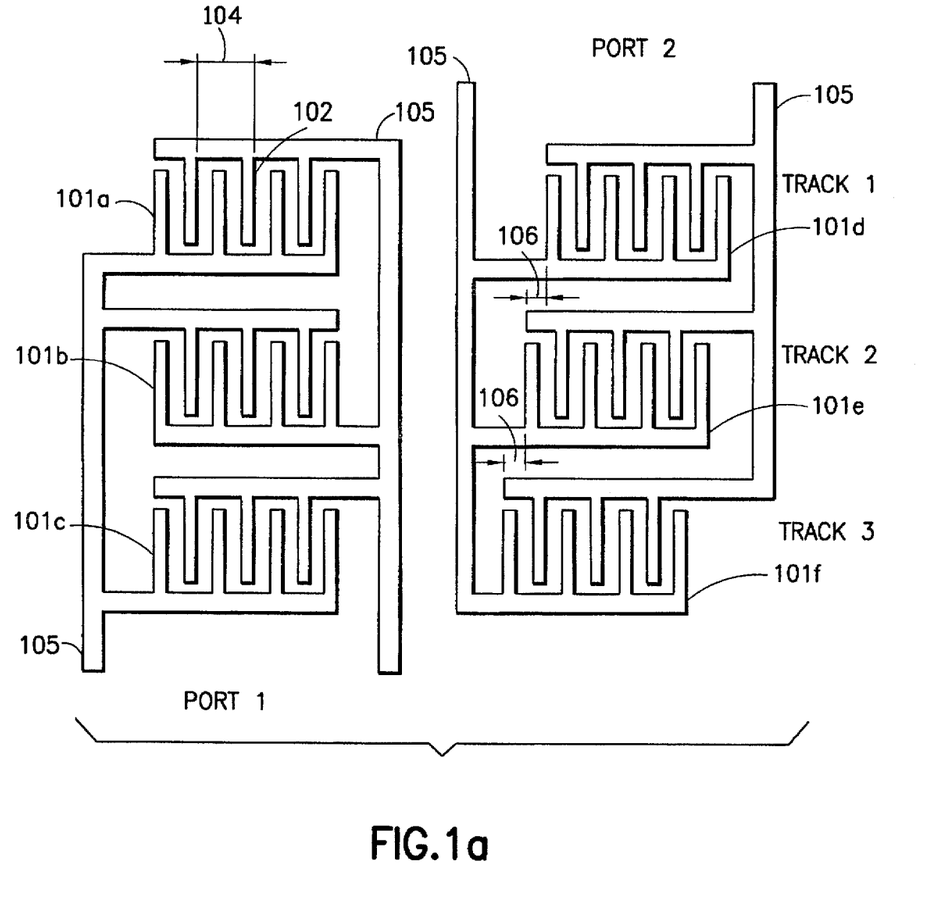
FIG. 1a is a schematic diagram of a 3 track device with an electrode connection of one IDT reversed.
Figure 1B:
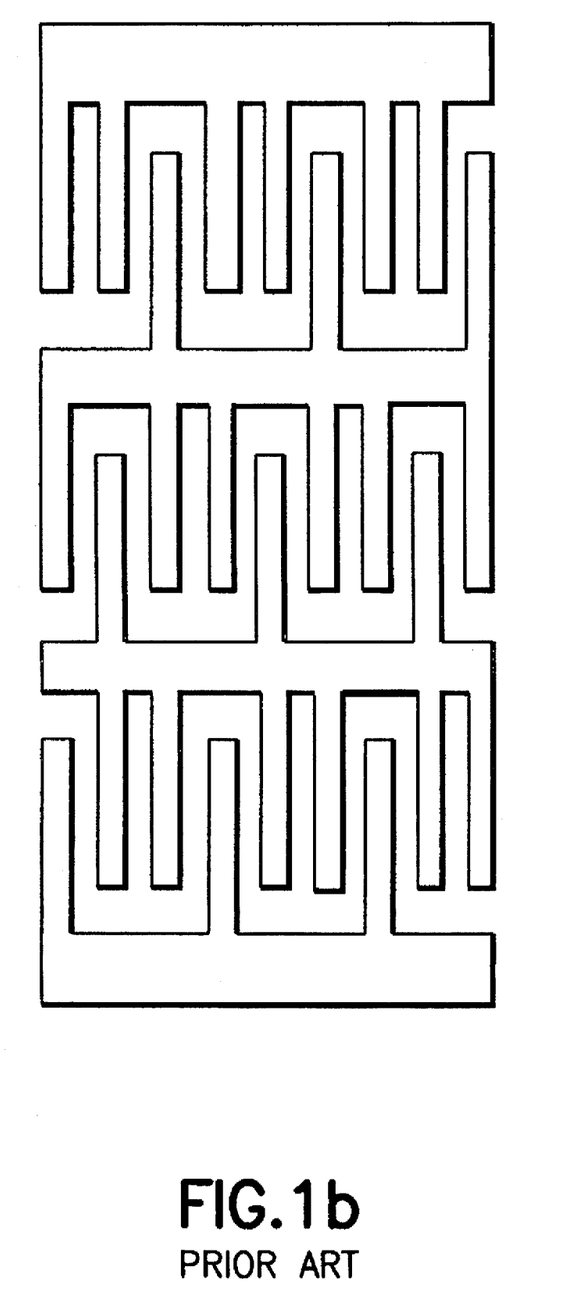
FIG. 1b is a schematic diagram of a prior art transducer.

Further ways of producing phase differences in adjacent tracks can be achieved by utilising different electrode structures or connections. For example, in a device utilising three tracks and series coupled multi-electrode IDTs having 3 electrodes per period a similar effect to having adjacent IDTs displaced by $\lambda/3$ can be achieved by appropriately connecting the electrodes in IDTs disposed in line with each other in adjacent tracks. FIG. 1b shows a known type of multi-electrode IDTs configuration connected in series and suitable as input or output ports. If each polarity electrode connection is represented by a + or − sign then the following tables show the electrode connections.

TABLE 1

| Track 1: | + + − + + − + + − . . . |
| Track 2: | + − + + − + + − + . . . |
| Track 3: | − + + − + + − + + . . . |

Alternatively, the electrodes could be connected thus.

TABLE 2

| Track 1: | − − + − − + − − + . . . |
| Track 2: | − + − − + − − + − . . . |
| Track 3: | + − − + − − + − − . . . |

The waves generated by IDTs in tracks 2 and 3 having electrodes connected in accordance with one of the schemes shown above have phases differing by 120° and 240° respectively relative to the IDT in track 1. Such IDTs could be utilised in separate tracks of a three track device to provide the requisite phase differences between tracks without having to displace IDTs.

Another way of utilising electrode structure and electrical connections to obtain phase differences is to invert the electrode connections in an input or output IDT. Again, using the three track device as an example it is possible to obtain $\lambda/3$ (120°) phase displacements by a $\lambda/6$ (60°) displacement plus electrode reversal, as seen in FIG. 1a, wherein the electrode connection IDT 101b is reversed with respect to the polarity of the electrical connections of the IDTs of the other tracks. The reversal effectively gives a $\lambda/2$ phase displacement which by subtracting $\lambda/6$ gives $\lambda/3$ (120°) phase displacement, and by adding $\lambda/6$ gives 2 $\lambda/3$ (240°) phase displacement. Since there is a small phase displacement between adjacent tracks −$\lambda/6$ and +$\lambda/6$, the direct coupling between input and output IDTs is reduced, which reduces the side-lobe levels compared with devices having phase displacements of $\lambda/3$ between adjacent tracks.

Figure 6A:
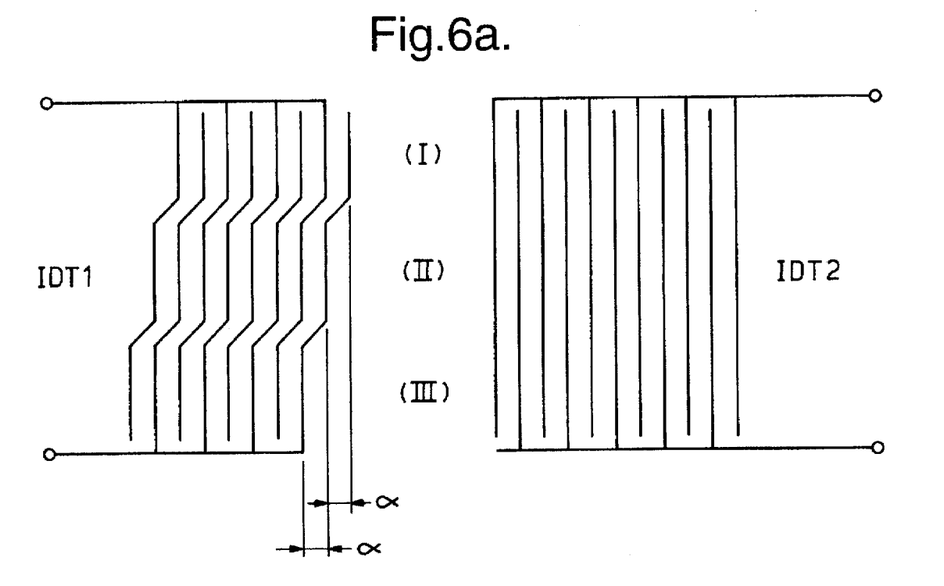
FIG. 6a shows an arrangement where the IDTs have their electrodes joined together.

Although the foregoing examples refer to devices having tracks in which adjacent input or output IDTs are separate this need not be the case. An IDT could have all the electrode fingers corresponding to different tracks connected together. FIG. 6 shows examples of such arrangements. In FIG. 6(a) the electrodes of IDT 1 are bent so that regions of the electrodes are respectively displaced by $\alpha$ and $2\alpha$ with respect to a reference region. These different regions effectively create different adjacent tracks, labelled (I), (II) and III in FIG. 6(a), each being out of phase with each other. Waves launched from IDT1 undergo transduction and the resulting voltages combine. If they are coherent then an output voltage is produced if they are not then zero net voltage is produced and the wave is reflected.

Figure 6B:
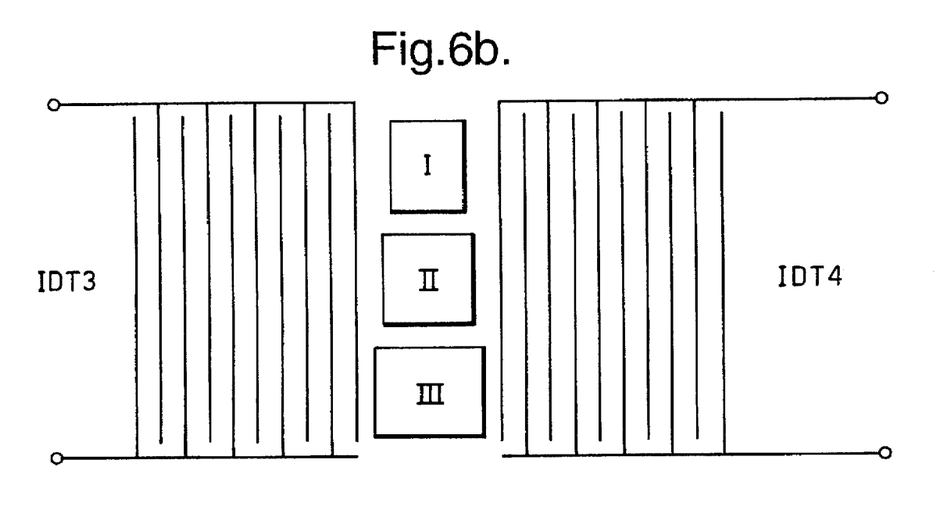
FIG. 6b shows an alternative arrangement where the IDTs have their electrodes joined together.

A similar situation is shown in FIG. 6(b), but in this example the phase differences are provided by pads I, II and III which define three adjacent tracks having different phases. For the state of clarity and to avoid any doubt, references to tracks in the description and claims shall also be taken to include regions as defined above.

In view of the foregoing description it will be evident to a person skilled in the art that various modifications may be made within the scope of the invention and for example, in addition to the conventional Surface Acoustic Wave other types of wave are often used for devices similar to SAW devices in which transduction is accomplished by metal strips applied to the surface. These include surface-skimming bulk waves (SSBWs), leaky waves and surface transverse waves (STWs). The present invention is applicable to these waves as well as SAWs. For those waves it is quite common to include structures such as grooves or metal gratings in regions between the active components in order to confine the waves at the surface of the substrate. A device in accordance with the present invention could if necessary include such structures, with the design allowing for velocity shifts in these structures as necessary. Additionally, the form of the electrodes in each transducer may vary, for example, in width, spacing or even number per period.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What is claimed is:

1. A SAW filter comprising a group of N tracks, where N is an odd integer greater than 2, including an input interdigitated transducer (IDT) spaced apart from an output IDT, wherein respective tracks are adapted to have different effective electro-acoustic lengths such that surface acoustic waves launched into respective tracks from input IDT undergo at least one reflection at the corresponding output IDT and at least one reflection from said input IDT prior to forming a substantially coherent signal at the output IDT, wherein the effective electro-acoustic lengths of respective tracks have phase differences relative to a reference track corresponding to $2\pi rm/N$ where r corresponds to a sequential integer number of each track relative to the reference track that is greater than 0, not a multiple of N and not an integer multiple of $2\pi$, and m is a number of transits of a wave prior to forming the signal.

2. A SAW filter according to claims 1, wherein the input and output IDT comprise single electrode IDTs.

3. A SAW filter according to claim 1, wherein the input IDT comprises N respective input IDTs electrically coupled together and corresponding to said respective tracks.

4. A SAW filter according to claim 1, wherein the effective electro-acoustic lengths of respective tracks are selected such that signals from respective tracks undergoing less than a total of N−1 reflections are mutually cancelled.

5. A SAW filter according to claim 1, wherein the input and output IDT comprise directional transducers.

6. A SAW filter according to claim 1, wherein the different effective electro-acoustic lengths are substantially provided by electrical phase shifting networks.

7. A SAW filter according to claim 1, wherein the different effective electro-acoustic lengths are substantially provided by respective tracks having different physical separation between the input and output IDT.

8. A SAW filter according to claim 1, wherein different effective electro-acoustic lengths are substantially provided by different amounts of material disposed in respective tracks between the input and output IDT.

9. A SAW filter according to claim 1, wherein the output IDT comprises N respective output IDTs electrically coupled together and corresponding to said respective tracks.

10. A SAW filter according to claim 9, wherein the electrode connections of at least one of the respective IDTs is reversed with respect to the polarity of the electrode connections of the IDTs of other tracks.

11. A SAW filter according to claim 9, wherein respective output IDTs and respective input IDTs are electrically coupled in series.

12. A SAW filter according to claim 11, wherein the respective input and respective output IDT each have more than one electrode per period.

13. A SAW filter according to claim 12, wherein the different electro-acoustic lengths are substantially provided by electrodes in corresponding periods of IDTs in respective tracks having different polarity connections.

14. A SAW filter comprising a group of N tracks, where N is an odd integer greater than 2, including an input interdigitated transducer (IDT) spaced apart from an output IDT, wherein respective tracks are adapted to have different effective electro-acoustic lengths such that surface acoustic waves launched into respective tracks from input IDT undergo at least one reflection at the corresponding output IDT and at least one reflection from said input IDT prior to forming a substantially coherent signal at the output IDT, wherein the electrode connection of at least one of the IDTs is reversed with respect to the polarity of the electrode connections of the IDTs of other tracks that are electrically connected to the at least one IDT.

* * * * *